United States Patent
Li

(10) Patent No.: US 11,056,057 B2
(45) Date of Patent: Jul. 6, 2021

(54) ARRAY SUBSTRATE, DISPLAY APPARATUS, AND METHOD OF DRIVING ARRAY SUBSTRATE

(71) Applicants: Hefei Xinsheng Optoelectronics Technology Co., Ltd., Anhui (CN); BOE Technology Group Co., Ltd., Beijing (CN)

(72) Inventor: Meng Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/639,116

(22) PCT Filed: Sep. 27, 2019

(86) PCT No.: PCT/CN2019/108594
§ 371 (c)(1),
(2) Date: Feb. 13, 2020

(87) PCT Pub. No.: WO2020/192056
PCT Pub. Date: Oct. 1, 2020

(65) Prior Publication Data
US 2021/0134223 A1    May 6, 2021

(30) Foreign Application Priority Data
Mar. 26, 2019 (CN) .......................... 201910232406.5

(51) Int. Cl.
*G09G 3/3291* (2016.01)
*G09G 3/3258* (2016.01)
(Continued)

(52) U.S. Cl.
CPC ......... *G09G 3/3258* (2013.01); *G09G 3/3266* (2013.01); *G09G 3/3291* (2013.01);
(Continued)

(58) Field of Classification Search
CPC ... G09G 2300/0426; G09G 2300/0452; G09G 3/2003; G09G 3/3607; G09G 3/3233;
(Continued)

(56) References Cited

U.S. PATENT DOCUMENTS 9,165,960 B2    10/2015 Tai et al.
2012/0242920 A1    9/2012 Xu et al.
(Continued)

FOREIGN PATENT DOCUMENTS

CN    101221337 A    7/2008
CN    101958102 A    1/2011
(Continued)

OTHER PUBLICATIONS

International Search Report & Written Opinion dated Jan. 6, 2020, regarding PCT/CN2019/108594.
(Continued)

*Primary Examiner* — Duc Q Dinh
(74) *Attorney, Agent, or Firm* — Intellectual Valley Law, P.C.

(57) ABSTRACT

An array substrate is provided. The array substrate includes a plurality of pixel groups, a respective one of the plurality of pixel groups including two adjacent pixels in a same row of pixels, a respective one of the two adjacent pixels including three subpixels; a plurality of scanning line groups configured to respectively control a plurality of rows of pixels, a respective one group of the plurality of scanning line groups including four scanning lines; and a plurality of data line groups respectively connected to a plurality of columns of pixel groups of the plurality of pixel groups, a (Continued)

respective one group of the plurality of data line groups including three data lines. The two adjacent pixels includes a first pixel and a second pixel. Each of the first pixel and the second pixel includes a first subpixel, a second subpixel, and a third subpixel.

20 Claims, 11 Drawing Sheets

(51) Int. Cl.
  *G09G 3/3266* (2016.01)
  *H01L 27/32* (2006.01)
(52) U.S. Cl.
  CPC ............ *G09G 2300/0452* (2013.01); *G09G 2320/0295* (2013.01); *H01L 27/3211* (2013.01); *H01L 27/3276* (2013.01)
(58) Field of Classification Search
  CPC ......... G09G 2300/0439; G09G 3/2074; G09G 3/3258; G09G 3/3291; G09G 3/3266; G09G 2320/0295; H01L 27/3211; H01L 27/3276
  USPC ...................................................... 345/76–79
  See application file for complete search history.

(56) References Cited

U.S. PATENT DOCUMENTS

| | | | |
|---|---|---|---|
| 2015/0333114 A1 | 11/2015 | Xu | |
| 2015/0364526 A1* | 12/2015 | Peng | ................... H01L 27/3216 257/40 |
| 2017/0059951 A1 | 3/2017 | Dun et al. | |
| 2017/0169767 A1* | 6/2017 | Song | .................... G09G 3/3291 |
| 2018/0254006 A1 | 9/2018 | Hwang et al. | |
| 2018/0308430 A1* | 10/2018 | Xu | ....................... G09G 3/3233 |

FOREIGN PATENT DOCUMENTS

| | | |
|---|---|---|
| CN | 102081270 A | 6/2011 |
| CN | 202049315 U | 11/2011 |
| CN | 103985354 A | 8/2014 |
| CN | 105280140 A | 1/2016 |
| CN | 107016964 A | 8/2017 |
| CN | 107038967 A | 8/2017 |
| CN | 207165217 U | 3/2018 |

OTHER PUBLICATIONS

First Office Action in the Chinese Patent Application No. 201910232406. 5, dated Mar. 23, 2020; English translation attached.

\* cited by examiner

ARRAY SUBSTRATE, DISPLAY APPARATUS, AND METHOD OF DRIVING ARRAY SUBSTRATE

CROSS-REFERENCE TO RELATED APPLICATION

This application is a national stage application under 35 U.S.C. § 371 of International Application No. PCT/CN2019/108594, filed Sep. 27, 2019, which claims priority to Chinese Patent Application No. 201910232406.5, filed Mar. 26, 2019. Each of the forgoing applications is herein incorporated by reference in its entirety for all purposes.

TECHNICAL FIELD

The present invention relates to display technology, more particularly, to an array substrate, a display apparatus, and a method of driving an array substrate.

BACKGROUND

Active Matrix Organic Light Emitting Diode (AMOLED) display is a type of Organic Light Emitting Diode (OLED) display. Compared with a liquid crystal display apparatus, an AMOLED display apparatus has advantages including faster speed, higher contrast, and wider viewing angle.

SUMMARY

In one aspect, the present invention provides an array substrate, comprising a plurality of pixel groups, a respective one of the plurality of pixel groups comprising two adjacent pixels in a same row of pixels, a respective one of the two adjacent pixels comprising three subpixels; a plurality of scanning line groups configured to respectively control a plurality of rows of pixels, a respective one group of the plurality of scanning line groups comprising four scanning lines; and a plurality of data line groups respectively connected to a plurality of columns of pixel groups of the plurality of pixel groups, a respective one group of the plurality of data line groups comprising three data lines; wherein the two adjacent pixels comprises a first pixel and a second pixel; each of the first pixel and the second pixel comprises a first subpixel, a second subpixel, and a third subpixel; each of the first subpixel, the second subpixel, and the third subpixel comprises a pixel driving circuit and a light emitting element connected to the pixel driving circuit, the pixel driving circuit comprising a switching thin film transistor, a driving thin film transistor, a sensing thin film transistor, and a storage capacitor; the four scanning lines comprises a first scanning line, a second scanning line, a third scanning line, and a fourth scanning line; a gate electrode of a switching thin film transistor of the first subpixel of the first pixel, a gate electrode of a switching thin film transistor of the second subpixel of the first pixel, and a gate electrode of a switching thin film transistor of the second subpixel of the second pixel are respectively connected to the first scanning line; a gate electrode of a sensing thin film transistor of the first subpixel of the first pixel, a gate electrode of a sensing thin film transistor of the second subpixel of the first pixel, and a gate electrode of a sensing thin film transistor of the second subpixel of the second pixel are respectively connected to the second scanning line; a gate electrode of a switching thin film transistor of the third subpixel of the first pixel, a gate electrode of a switching thin film transistor of the first subpixel of the second pixel, and a gate electrode of a switching thin film transistor of the third subpixel of the second pixel are respectively connected to the third scanning line; and a gate electrode of a sensing thin film transistor of the third subpixel of the first pixel, a gate electrode of a sensing thin film transistor of the first subpixel of the second pixel, and a gate electrode of a sensing thin film transistor of the third subpixel of the second pixel are respectively connected to the fourth scanning line.

Optionally, the respective one of the plurality of pixel groups comprises three pairs of subpixels respectively connected to the three data lines; in a respective pair of the three pairs of subpixels, one subpixel is connected to the first scanning line and the second scanning line, and another subpixel is connected to the third scanning line and the fourth scanning line.

Optionally, the first scanning line and the second scanning line are on a first side of the respective one of the plurality of pixel groups; and the third scanning line and the fourth scanning line are on a second side of the respective one of the plurality of pixel groups, the second side being opposite to the first side.

Optionally, the respective one of the group of the plurality of data line groups comprises a first data line, a second data line, and a third data line; the respective one of the plurality of pixel groups comprises a column comprising the first subpixel of the first pixel; a column comprising the second subpixel and the third subpixel of the first pixel; a column comprising the first subpixel of the second pixel; and a column comprising the second subpixel and the third subpixel of the second pixel; wherein the first data line is between the column having the first subpixel of the first pixel and the column having the second subpixel and the third subpixel of the first pixel; the second data line is between the first pixel and the second pixel; and the third data line is between the column having the first subpixel of the second pixel and the column having the second subpixel and the third subpixel of the second pixel.

Optionally, the array substrate is absent of any data line between two adjacent pixel groups of the plurality of pixel groups.

Optionally, a ratio of a total number of columns of subpixels to a total number of data lines is 4:3.

Optionally, a source electrode of the switching thin film transistor of the first subpixel of the first pixel and a source electrode of the switching thin film transistor of the third subpixel of the first pixel are respectively connected to the first data line; a source electrode of the switching thin film transistor of the second subpixel of the first pixel and a source electrode of the switching thin film transistor of the first subpixel of the second pixel are respectively connected to the second data line; and a source electrode of the switching thin film transistor of the second subpixel of the second pixel and a source electrode of the switching thin film transistor of the third subpixel of the second pixel are respectively connected to the third data line.

Optionally, the array substrate further comprises a plurality of power lines; wherein the three data lines and the plurality of power lines are arranged along a substantially same direction; and a respective one of the plurality of power lines is spaced apart by at least one columns of subpixels from any data line.

Optionally, a ratio of a total number of columns of subpixels to a total number of the plurality of power lines is 2:1.

Optionally, the array substrate further comprises a plurality of power lines; wherein a first power line of the plurality of power lines is connected to source electrodes of driving thin film transistors of the first subpixel of the first pixel, the second subpixel of the first pixel, and the third subpixel of the first pixel; at least a portion of the first power line is on a side of the first pixel away from the second pixel; a second power line of the plurality of power lines is connected to source electrode of driving thin film transistors of the first subpixel of the second pixel, the second subpixel of the second pixel, and the third subpixel of the second pixel; and at least a portion of the second power line is on a side of the second pixel away from the first pixel.

Optionally, the array substrate further comprises a plurality of sensing lines; wherein the three data lines, the plurality of power lines, and the plurality of sensing lines are arranged along a substantially same direction; and a first one of the plurality of sensing lines and one of the plurality of power lines are between two directly adjacent pixel groups of the plurality of pixel groups; and a second one of the plurality of sensing lines and one of the three data lines are between two pixels in a same pixel group of the plurality of pixel groups.

Optionally, a ratio of a total number of columns of subpixels to a total number of the plurality of sensing lines is 2:1.

Optionally, the array substrate further comprises a plurality of sensing lines; wherein a first sensing line of the plurality of sensing lines is connected to a drain electrode of a sensing thin film transistor of the first subpixel of the first pixel, a drain electrode of a sensing thin film transistor of the second subpixel of the first pixel, and a drain electrode of a sensing thin film transistor of the third subpixel of the first pixel; at least a portion of the first sensing line is between the first pixel and the second pixel; a second sensing line of the plurality of sensing lines is connected to a drain electrode of a sensing thin film transistor of the first subpixel of the second pixel, a drain electrode of a sensing thin film transistor of the second subpixel of the second pixel, and a drain electrode of a sensing thin film transistor of the third subpixel of the second pixel; and at least a portion of the second sensing line is on a side of the second pixel away from the first pixel.

Optionally, in a respective one of the three subpixels, a drain electrode of a switching thin film transistor is connected to a gate electrode of a driving thin film transistor and to a first electrode of a storage capacitor; a drain electrode of a driving thin film transistor is connected to a first electrode of a light emitting element, to a second electrode of the storage capacitor, and to a source electrode of a sensing thin film transistor; and a second electrode of the light emitting element is connected to a low voltage signal line.

Optionally, the respective one of the plurality pixels comprises a subpixel of a blue color, a subpixel of a green color, and a subpixel of a red color.

Optionally, the light emitting element is an organic light-emitting diode.

In another aspect, the present invention provides a display apparatus, comprising the array substrate described herein; and one or more integrated circuits connected to the array substrate.

In another aspect, the present invention provides a method of driving an array substrate, wherein the array substrate comprises a plurality of pixel groups, a respective one of the plurality of pixel groups comprising two adjacent pixels in a same row of pixels, a respective one of the two adjacent pixels comprising three subpixels of different colors; a plurality of scanning line groups configured to respectively control a plurality of rows of pixels, a respective one group of the plurality of scanning line groups comprising two sets of scanning lines; and a plurality of data line groups respectively connected to a plurality of columns of pixel groups of the plurality of pixel groups, a respective one group of the plurality of data line groups comprising three data lines; the method comprises displaying a frame of image comprising a plurality of sub-frames of sub-images; wherein, in a same sub-frame of sub-image, data signals are provided to any two subpixels that are respectively connected to a same set of two scanning lines but respectively connected to different data lines.

Optionally, data signals are provided to different subpixels in a same row of pixel groups of the plurality of pixel groups that are respectively connected to different data lines and respectively connected to different sets of two scanning lines respectively in different sub-frames of sub-images.

Optionally, in a same sub-frame of sub-image, data signals are applied to any two subpixels of a same color that are respectively connected to a same data line, wherein the any two subpixels that are respectively connected to the same data line are respectively connected to different sets of two scanning lines.

Optionally, data signals are provided to any two subpixels of different colors that are respectively connected to a same data line but respectively connected to different sets of two scanning lines, respectively in different sub-frames of sub-images.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
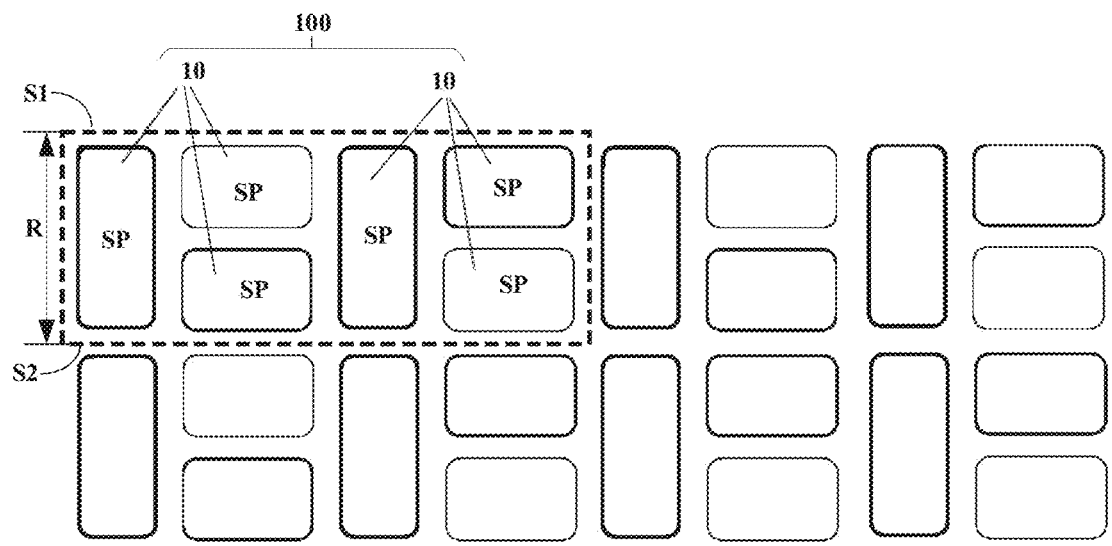
FIG. 1 is a schematic diagram illustrating an arrangement of subpixels in an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Display panels having 8K resolution are relatively rare in the market due to difficulties of fabricating the display panel having 8K resolution, and the difficulties mainly include high fabrication cost and crowed space for pixel arrangement.

Accordingly, the present disclosure provides, inter alia, an array substrate, a display apparatus, and a method of driving an array substrate that substantially obviate one or more of the problems due to limitations and disadvantages of the related art. In one aspect, the present disclosure provides an array substrate. In some embodiments, the array substrate includes a plurality of pixel groups, optionally, a respective one of the plurality of pixel groups includes two adjacent pixels in a same row of pixels, optionally, a respective one of the two adjacent pixels includes three subpixels. In some embodiments, the array substrate includes a plurality of scanning line groups configured to respectively control a plurality of rows of pixels, optionally, a respective one group of the plurality of scanning line groups includes four scanning lines. In some embodiments, the array substrate includes a plurality of data line groups respectively connected to a plurality of columns of pixel groups of the plurality of pixel groups, optionally, a respective one group of the plurality of data line groups includes three data lines. In some embodiments, the two adjacent pixels includes a first pixel and a second pixel. Optionally, each of the first pixel and the second pixel includes a first subpixel, a second subpixel, and a third subpixel. Optionally, each of the first subpixel, the second subpixel, and the third subpixel includes a pixel driving circuit and a light emitting element connected to the pixel driving circuit, the pixel driving circuit includes a switching thin film transistor, a driving thin film transistor, a sensing thin film transistor, and a storage capacitor. Optionally, the four scanning lines includes a first scanning line, a second scanning line, a third scanning line, and a fourth scanning line. Optionally, a gate electrode of a switching thin film transistor of the first subpixel of the first pixel, a gate electrode of a switching thin film transistor of the second subpixel of the first pixel, and a gate electrode of a switching thin film transistor of the second subpixel of the second pixel are respectively connected to the first scanning line. Optionally, a gate electrode of a sensing thin film transistor of the first subpixel of the first pixel, a gate electrode of a sensing thin film transistor of the second subpixel of the first pixel, and a gate electrode of a sensing thin film transistor of the second subpixel of the second pixel are respectively connected to the second scanning line. Optionally, a gate electrode of a switching thin film transistor of the third subpixel of the first pixel, a gate electrode of a switching thin film transistor of the first subpixel of the second pixel, and a gate electrode of a switching thin film transistor of the third subpixel of the second pixel are respectively connected to the third scanning line. Optionally, a gate electrode of a sensing thin film transistor of the third subpixel of the first pixel, a gate electrode of a sensing thin film transistor of the first subpixel of the second pixel, and a gate electrode of a sensing thin film transistor of the third subpixel of the second pixel are respectively connected to the fourth scanning line.

FIG. 1 is a schematic diagram illustrating an arrangement of subpixels in an array substrate in some embodiments according to the present disclosure. In some embodiments, referring to FIG. 1, the array substrate includes a plurality of pixel groups 100. Optionally, a respective one of the plurality of pixel groups 100 includes two adjacent pixels 10 in a same row of pixels of a plurality of rows of pixels R. Optionally, a respective one of the two adjacent pixels 10 includes three subpixels SP.

Figure 2:
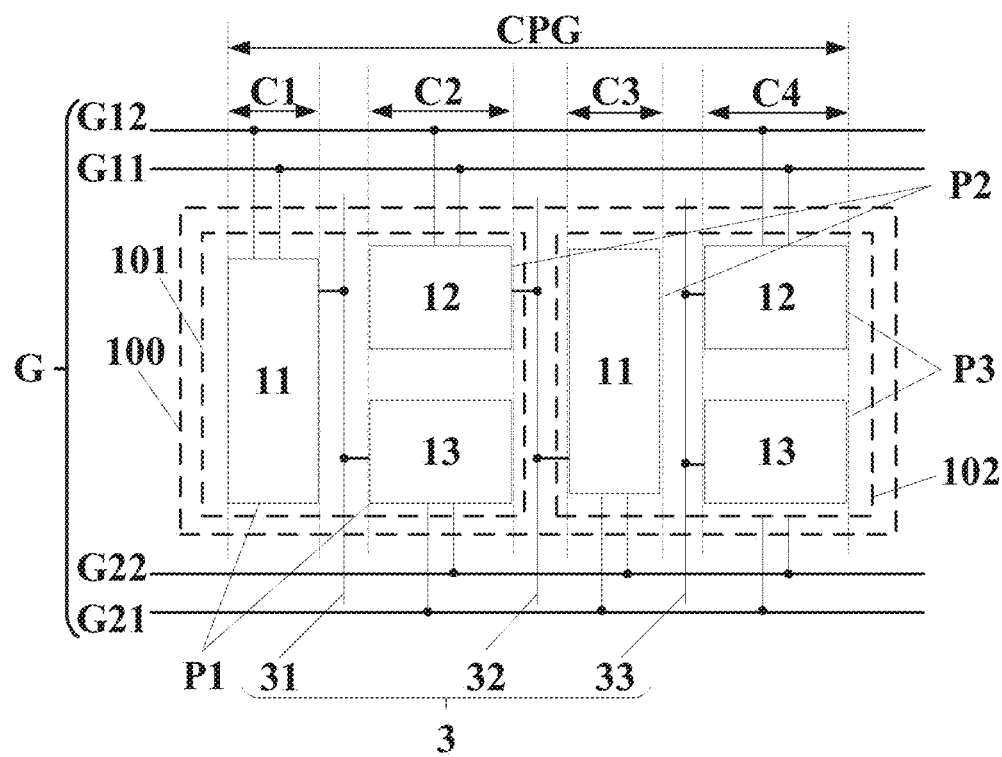
FIG. 2 is a circuit diagram of an array substrate in some embodiments according to the present disclosure.

FIG. 2 is a circuit diagram of an array substrate in some embodiments according to the present disclosure. Referring to FIG. 1 and FIG. 2, the two adjacent pixels 10 includes a first pixel 101 and a second pixel 102. Each of the first pixel 101 and the second pixel 102 includes a first subpixel 11, a second subpixel 12, and a third subpixel 13.

In some embodiments, referring to FIG. 2, the array substrate includes a plurality of scanning line groups G configured to respectively control a plurality of rows of pixels R. Optionally, a respective one group of the plurality of scanning line groups G includes four scanning lines, for example, a first scanning line G11, a second scanning line G12, a third scanning line G21, and a fourth scanning line G22.

In some embodiments, the array substrate includes a plurality of data line groups 3 respectively connected to a plurality of columns of pixel groups CPG of the plurality of pixel groups 100. Optionally, a respective one group of the plurality of data line groups 3 includes three data lines, for example, a first data line 31, a second data line 32, and a third data line 33.

Figure 3:
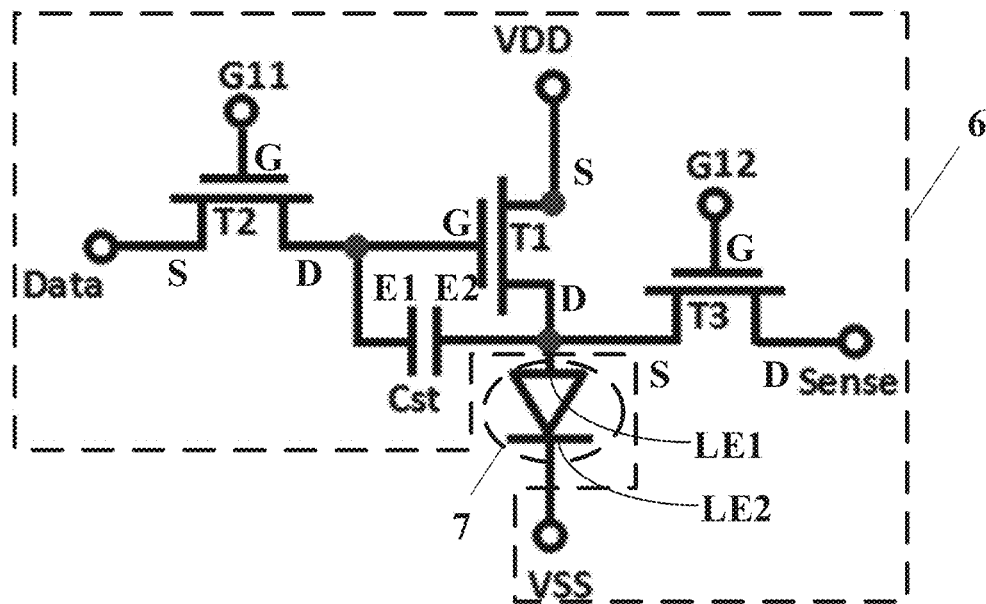
FIG. 3 is a circuit diagram of a subpixel in an array substrate in some embodiments according to the present disclosure.
Figure 4:
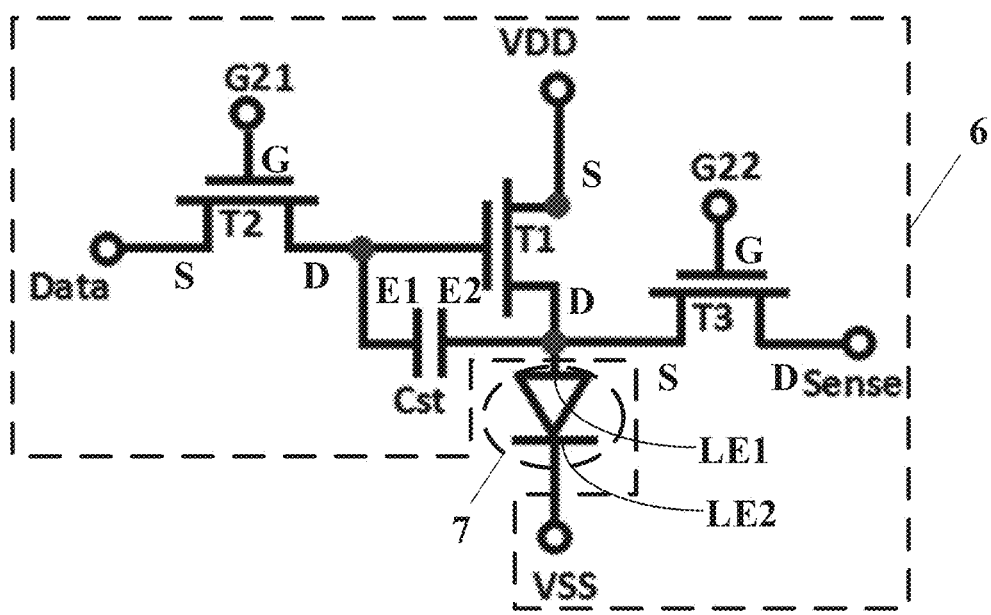
FIG. 4 is a circuit diagram of a subpixel in an array substrate in some embodiments according to the present disclosure.

FIG. 3 is a circuit diagram of a subpixel in an array substrate in some embodiments according to the present disclosure. FIG. 4 is a circuit diagram of a subpixel in an array substrate in some embodiments according to the present disclosure. In some embodiments, referring to FIG. 2, FIG. 3, and FIG. 4, each of the first subpixel 11, the second subpixel 12, and the third subpixel 13 includes a pixel driving circuit 6 and a light emitting element 7 connected to the pixel driving circuit 6. Optionally, the pixel driving circuit 6 includes a switching thin film transistor T2, a driving thin film transistor T1, a sensing thin film transistor T3, and a storage capacitor Cst. Optionally, the light emitting element 7 is an organic light-emitting diode.

Optionally, referring to FIG. 2 and FIG. 3, a gate electrode G of a switching thin film transistor T2 of the first subpixel 11 of the first pixel 101, a gate electrode G of a switching thin film transistor T2 of the second subpixel 12 of the first pixel 101, and a gate electrode G of a switching thin film transistor T2 of the second subpixel 12 of the second pixel 102 are respectively connected to the first scanning line G11.

Optionally, referring to FIG. 2 and FIG. 3, a gate electrode G of a sensing thin film transistor T3 of the first subpixel 11 of the first pixel 101, a gate electrode G of a sensing thin film transistor T3 of the second subpixel 12 of the first pixel 101, and a gate electrode G of a sensing thin film transistor T3 of the second subpixel 12 of the second pixel 102 are respectively connected to the second scanning line G12.

Optionally, referring to FIG. 2 and FIG. 4, a gate electrode G of a switching thin film transistor T2 of the third subpixel 13 of the first pixel 101, a gate electrode G of a switching thin film transistor T2 of the first subpixel 11 of the second pixel 102, and a gate electrode G of a switching thin film transistor T2 of the third subpixel 13 of the second pixel 102 are respectively connected to the third scanning line G21.

Optionally, referring to FIG. 2 and FIG. 4, a gate electrode G of a sensing thin film transistor T3 of the third subpixel 13 of the first pixel 101, a gate electrode G of a sensing thin film transistor T3 of the first subpixel 11 of the second pixel 102, and a gate electrode G of a sensing thin film transistor T3 of the third subpixel 13 of the second pixel 102 are respectively connected to the fourth scanning line G22.

In some embodiments, the respective one of the plurality of pixel groups includes three pairs of subpixels respectively connected to the three data lines. Optionally, in a respective pair of the three pairs of subpixels, one subpixel is connected to the first scanning line and the second scanning line, and another subpixel is connected to the third scanning line and the fourth scanning line.

For example, referring to FIG. 2, the three pairs of subpixels are a first pair of subpixels P1 including the first subpixel 11 of the first pixel 101 and the third subpixel 13 of the first pixel 101, a second pair of subpixels P2 including the second subpixel 12 of the first pixel 101 and the first subpixel 11 of the second pixel 102, and a third pair of subpixels P3 including the second subpixel 12 of the second pixel 102 and the third subpixel 13 of the second pixel 102.

In the first pair of subpixels P1, the first subpixel 11 of the first pixel 101 is connected to the first scanning line G11 and the second scanning line G12, and the third subpixel 13 of the first pixel 101 is connected to the third scanning line G21 and the fourth scanning line G22.

In the second pair of subpixels P2, the second subpixel 12 of the first pixel 101 is connected to the first scanning line G11 and the second scanning line G12, and the first subpixel 11 of the second pixel 102 is connected to the third scanning line G21 and the fourth scanning line G22.

In the third pair of subpixels P3, the second subpixel 12 of the second pixel 102 is connected to the first scanning line G11 and the second scanning line G12, and third subpixel 13 of the second pixel 102 is connected to the third scanning line G21 and the fourth scanning line G22.

The respective one of the plurality of pixel groups includes six subpixels, the six subpixels are divided into three pairs of subpixels, each pair of the three pairs of subpixels is connected to a same data line, so, three data lines are configured to control the six subpixels in the respective one of the plurality of pixel groups. In this arrangement, a pairs of subpixels shares a same data line, a total number of data lines of this arrangement is half of a total number of data lines in an arrangement that a plurality of subpixels in a same row of subpixels are respectively connected to a plurality of data lines, which may reduce space used for accommodating the data lines in the arrangement that the pairs of subpixels shares the same data line. The array substrate having the arrangement that the pairs of subpixels shares the data line is suitable to be used in any kind of display apparatus, especially for display apparatus having 8K resolution.

In some embodiments, the four scanning lines in a respective one group of the plurality of scanning line groups are arranged on two sides of a respective one of the plurality of rows of pixels.

In some embodiments, referring to FIG. 1 and FIG. 2, the first scanning line G11 and the second scanning line G12 are on a first side S1 of the respective one of the plurality of pixel groups 100; and the third scanning line G21 and the fourth scanning line G22 are on a second side S2 of the respective one of the plurality of pixel groups 100. Optionally, the second side S2 is opposite to the first side S1.

In some embodiments, referring to FIG. 2, the respective one of the plurality of pixel groups 100 includes a column C1 including the first subpixel 11 of the first pixel 101; a column C2 including the second subpixel 12 of the first pixel 101 and the third subpixel 13 of the first pixel 101; a column C3 including the first subpixel 11 of the second pixel 102; and a column C4 including the second subpixel 12 of the second pixel 102 and the third subpixel 13 of the second pixel 102.

Optionally, the first data line 31 is between the column C1 having the first subpixel 11 of the first pixel 101 and the column C2 having the second subpixel 12 of the first pixel 101 and the third subpixel 13 of the first pixel 101. Optionally, the second data line 32 is between the first pixel 101 and the second pixel 102. Optionally, the third data line 33 is between the column C3 having the first subpixel 11 of the second pixel 102 and the column C4 having the second subpixel 12 of the second pixel 102 and the third subpixel 13 of the second pixel 102.

Figure 5A:
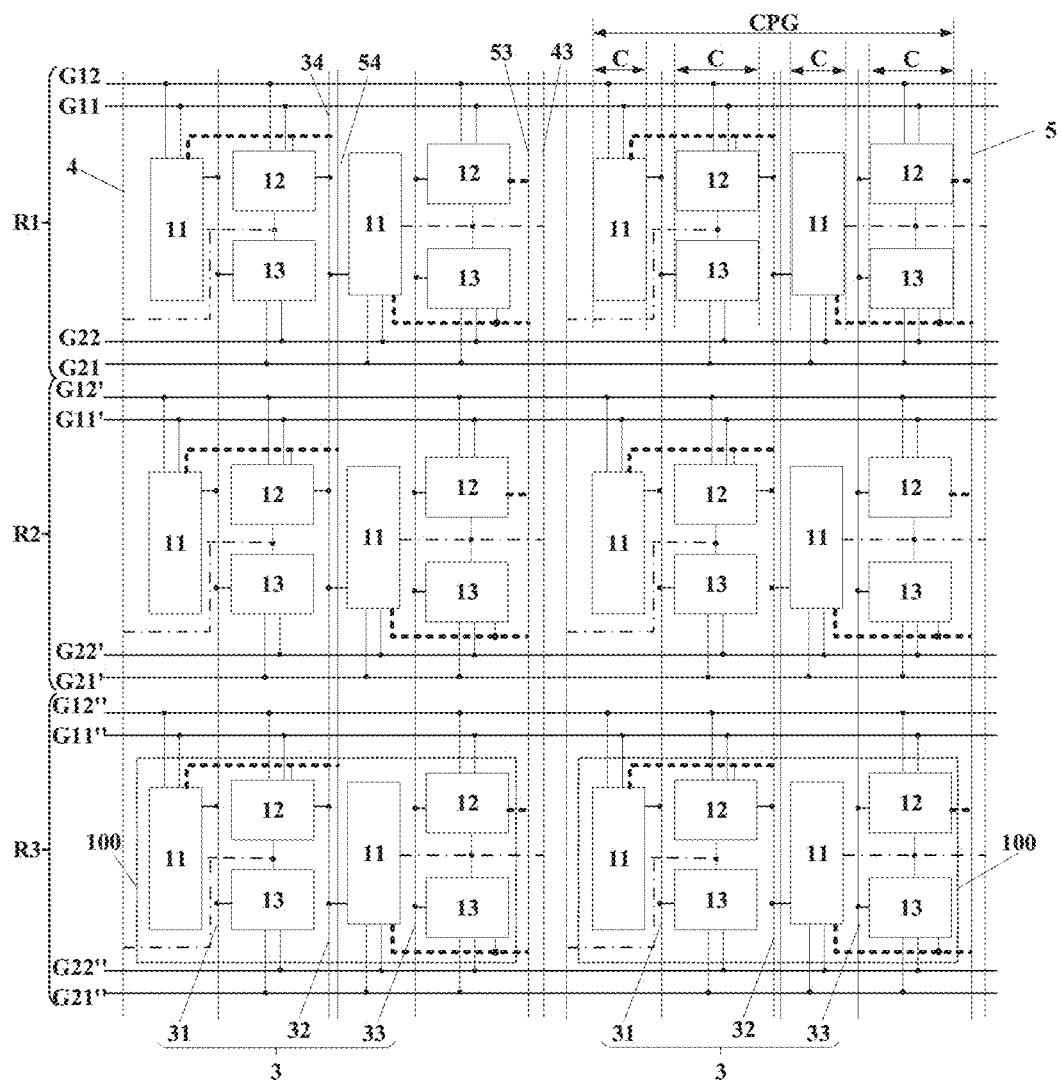
FIG. 5A is a circuit diagram illustrating an arrangement of data lines in an array substrate in some embodiments according to the present disclosure.
Figure 5B:
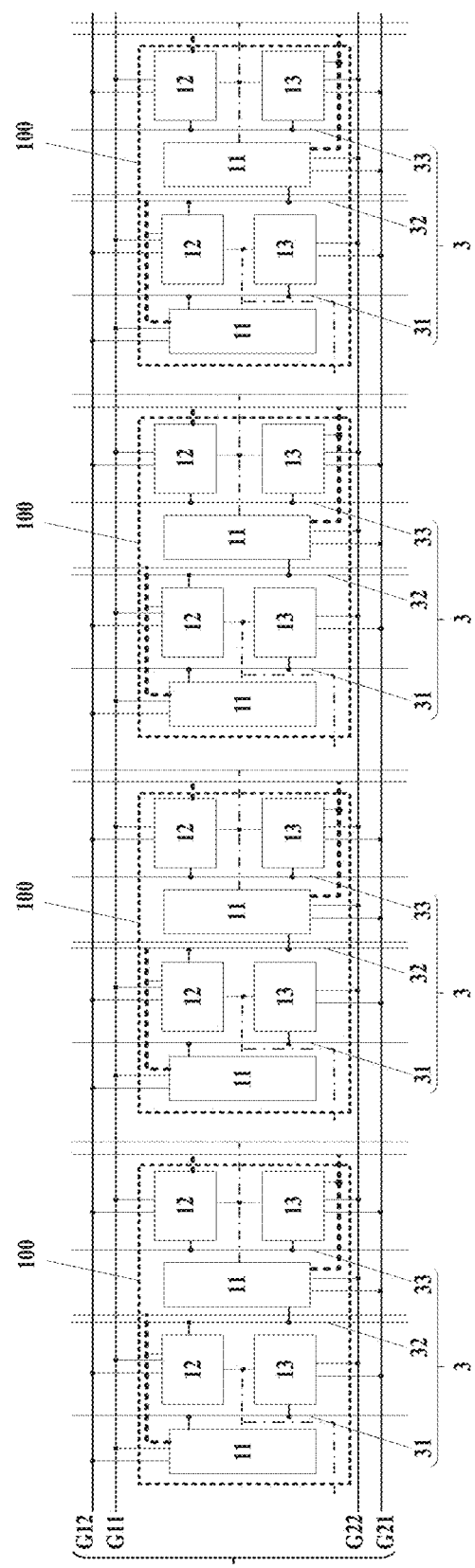
FIG. 5B is a circuit diagram illustrating an arrangement of data lines in an array substrate in some embodiments according to the present disclosure.

FIG. 5A is a circuit diagram illustrating an arrangement of data lines in an array substrate in some embodiments according to the present disclosure. FIG. 5B is a circuit diagram illustrating an arrangement of data lines in an array substrate in some embodiments according to the present disclosure. In some embodiments, referring to FIG. 1, FIG. 5A, and FIG. 5B, the array substrate is absent of any data line (e.g., the first data line 31, the second data line 32, and the third data line 33) between two adjacent pixel groups of the plurality of pixel groups 100.

In some embodiments, a ratio of a total number of columns of subpixels C to a total number of data lines is 4:3.

In some embodiment, referring to FIG. 2, FIG. 3, and FIG. 4, a source electrode S of the switching thin film transistor T2 of the first subpixel 11 of the first pixel 101 and a source electrode S of the switching thin film transistor T2 of the third subpixel 13 of the first pixel 101 are respectively connected to the first data line 31. A source electrode S of the switching thin film transistor T2 of the second subpixel 12 of the first pixel 101 and a source electrode S of the switching thin film transistor T2 of the first subpixel 11 of the second pixel 102 are respectively connected to the second data line 32. A source electrode S of the switching thin film transistor T2 of the second subpixel 12 of the second pixel 102 and a source electrode S of the switching thin film transistor T2 of the third subpixel 13 of the second pixel 102 are respectively connected to the third data line 33.

Figure 6:
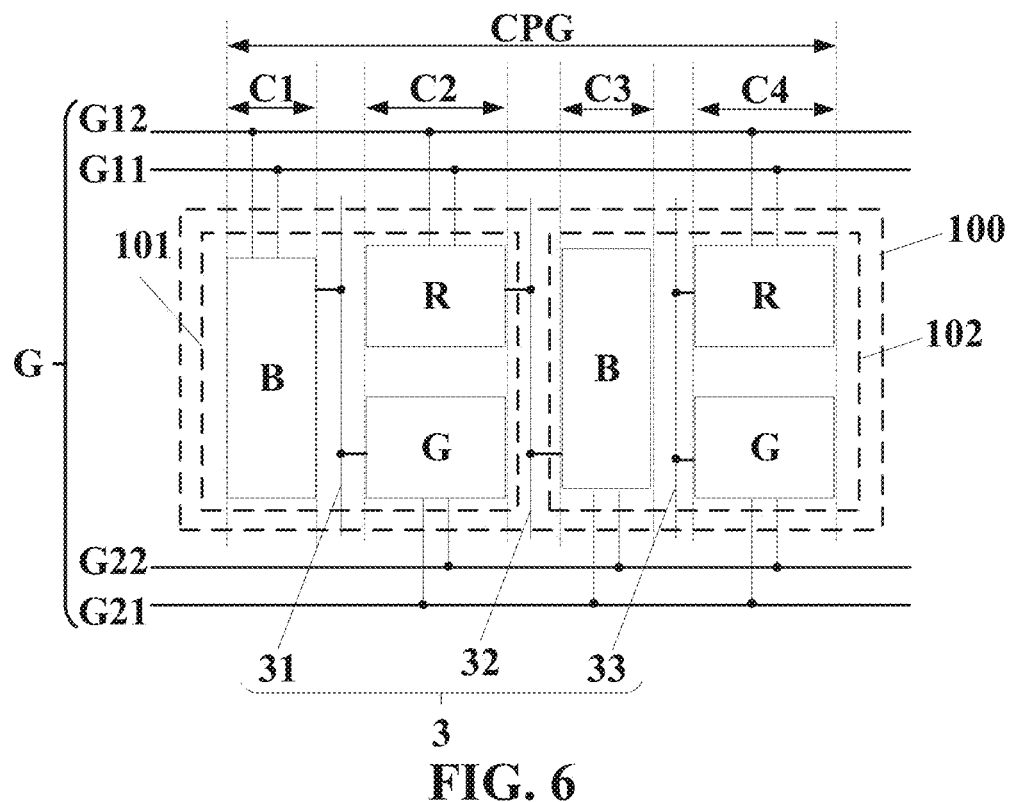
FIG. 6 is a circuit diagram illustrating an arrangement of data lines in an array substrate in some embodiments according to the present disclosure.

FIG. 6 is a circuit diagram illustrating an arrangement of data lines in an array substrate in some embodiments according to the present disclosure. In some embodiments, referring to FIG. 6, the respective one of the plurality of pixel groups 100 includes a first pixel 101, and a second pixel 102. For example, a pixel in a left dotted box is the first pixel 101, a pixel in a right dotted box is the second pixel 102. Each of the first pixel 101 and the second pixel 102 includes a first subpixel, a second subpixel, and a third subpixel.

In some embodiments, the respective one of the plurality pixels includes a subpixel of a blue color, a subpixel of a green color, and a subpixel of a red color. In one example, referring to FIG. 2 and FIG. 6, the first subpixel 11 is a subpixel of the blue color B, the second subpixel 12 is a subpixel of the red color R. and the third subpixel 13 is a subpixel of the green color G.

Figure 7:
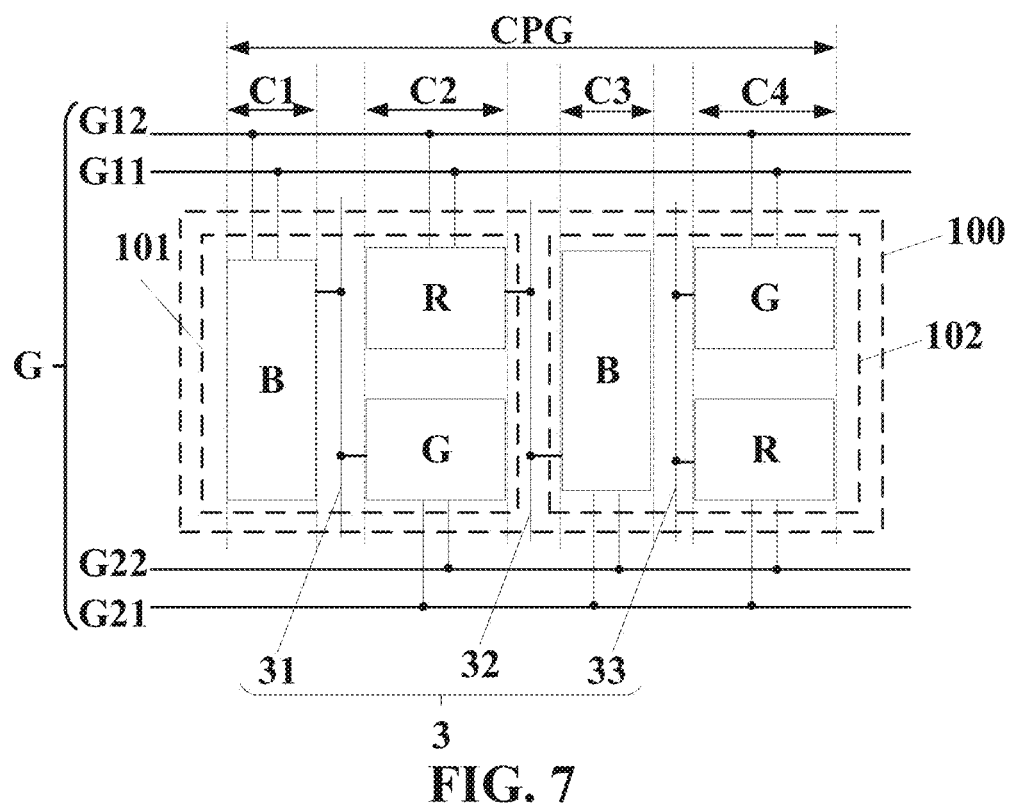
FIG. 7 is a circuit diagram illustrating an arrangement of data lines in an array substrate in some embodiments according to the present disclosure.

FIG. 7 is a circuit diagram illustrating an arrangement of data lines in an array substrate in some embodiments according to the present disclosure. In another example, referring to FIG. 2 and FIG. 7, the first subpixel 11 of the first pixel 101 is a subpixel of the blue color B, the second subpixel 12 of the first pixel 101 is a subpixel of the red color R, the third subpixel 13 of the first pixel 101 is a subpixel of the green color, the first subpixel 11 of the second pixel 102 is a subpixel of the blue color B, the second subpixel 12 of the second pixel 102 is a subpixel of the green color G, and the third subpixel 13 of the second pixel 102 is a subpixel of red color R.

Optionally, referring to FIG. 6 and FIG. 3, a gate electrode G of a switching thin film transistor T2 of the subpixel of the blue color B of the first pixel 101, a gate electrode G of a switching thin film transistor T2 of the subpixel of the red color R of the first pixel 101, and a gate electrode G of a switching thin film transistor T2 of the subpixel of the red color R of the second pixel 102 are respectively connected to the first scanning line G11.

Optionally, referring to FIG. 6 and FIG. 3, a gate electrode G of a sensing thin film transistor T3 of the subpixel of the blue color B of the first pixel 101, a gate electrode G of a sensing thin film transistor T3 of the subpixel of the red color R of the first pixel 101, and a gate electrode G of a sensing thin film transistor T3 of the subpixel of the red color R of the second pixel 102 are respectively connected to the second scanning line G12.

Optionally, referring to FIG. 6 and FIG. 4, a gate electrode G of a switching thin film transistor T2 of the subpixel of the green color G of the first pixel 101, a gate electrode G of a switching thin film transistor T2 of the subpixel of the blue color B of the second pixel 102, and a gate electrode G of a switching thin film transistor T2 of the subpixel of the green color G of the second pixel 102 are respectively connected to the third scanning line G21.

Optionally, referring to FIG. 6 and FIG. 4, a gate electrode G of a sensing thin film transistor T3 of the subpixel of the green color G of the first pixel 101, a gate electrode G of a sensing thin film transistor T3 of the subpixel of the blue color B of the second pixel 102, and a gate electrode G of a sensing thin film transistor T3 of the subpixel of the green color G of the second pixel 102 are respectively connected to the fourth scanning line G22.

In some embodiments, referring to FIG. 6, the respective one of the plurality of pixel groups 100 includes a column C1 including the subpixel of the blue color B of the first pixel 101; a column C2 including the subpixel of the red color R of the first pixel 101 and the subpixel of the green color G of the first pixel 101; a column C3 including the subpixel of the blue color B of the second pixel 102; and a column C4 including the subpixel of the red color R of the second pixel 102 and the subpixel of the green color G of the second pixel 102.

Optionally, the first data line 31 is between the column C1 having the subpixel of the blue color B of the first pixel 101 and the column C2 having the subpixel of the red color R of the first pixel 101 and the subpixel of the green color G of the first pixel 101. Optionally, the second data line 32 is between the first pixel 101 and the second pixel 102. Optionally, the third data line 33 is between the column C3 having the subpixel of the blue color B of the second pixel 102 and the column C4 having the subpixel of the red color R of the second pixel 102 and the subpixel of the green color G of the second pixel 102.

In some embodiment, referring to FIG. 6, FIG. 3, and FIG. 4 a source electrode S of the switching thin film transistor T2 of the subpixel of the blue color B of the first pixel 101 and a source electrode S of the switching thin film transistor T2 of the subpixel of the green color G of the first pixel 101 are respectively connected to the first data line 31. A source electrode S of the switching thin film transistor T2 of the subpixel of the red color R of the first pixel 101 and a source electrode S of the switching thin film transistor T2 of the subpixel of the blue color B of the second pixel 102 are respectively connected to the second data line 32. A source electrode S of the switching thin film transistor T2 of the subpixel of the red color R of the second pixel 102 and a source electrode S of the switching thin film transistor T2 of the subpixel of the green color G of the second pixel 102 are respectively connected to the third data line 33.

Figure 8:
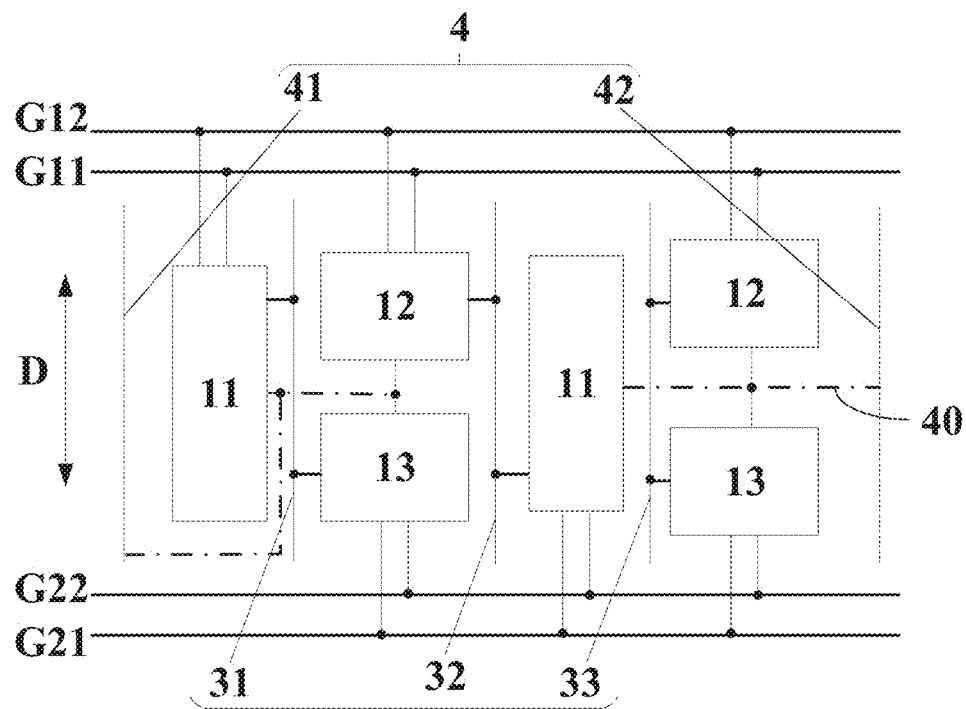
FIG. 8 is a circuit diagram illustrating an arrangement of in an array substrate in some embodiments according to the present disclosure.

FIG. 8 is a circuit diagram illustrating an arrangement of power lines in an array substrate in some embodiments according to the present disclosure. In some embodiments, referring to FIG. 8, the array substrate further includes a plurality of power lines 4 (e.g., VDD lines). Optionally, the three data lines (e.g., the first data line 31, the second data line 32, and the third data line 33) and the plurality of power lines 4 are arranged along a substantially same direction D, for example, the direction D is a column direction. For example, a respective one of the plurality of power lines 4 is a continuous line extending along the column direction (e.g., the direction D).

Optionally, a respective one of the plurality of power lines 4 is spaced apart by at least one columns of subpixels from any data line. Optionally, a region between two pixels 10 of the respective one of the plurality of pixel groups 100 are absent of any power line. Optionally, the array substrate further includes a plurality of power branches 40, shown in FIG. 8 with dashdotted lines. Three power branches of the plurality of power branches 40 are configured to respectively connect three subpixels in a respective one of the plurality of pixels to a same power line.

Optionally, referring to FIG. 8, a ratio of a total number of columns of subpixels to a total number of the plurality of power lines 4 is 2:1. Optionally, a column of pixel groups 100 is between two adjacent power lines of the plurality of power lines 4. Optionally, two columns of subpixels are between two adjacent power lines of the plurality of power lines 4. Optionally, a region between the first pixel 101 and the second pixel 102 in the respective one of the plurality of pixel groups 100 is absent of any power line.

In some embodiments, referring to FIG. 8, FIG. 3, and FIG. 4, the plurality of power lines 4 include a first power line 41 and a second power line 42. Optionally, a first power line 41 of the plurality of power lines 4 is connected to source electrodes S of driving thin film transistors T1 of the first subpixel 11 of the first pixel 101, the second subpixel 12 of the first pixel 101, and the third subpixel 13 of the first pixel 101. Optionally, at least a portion of the first power line 41 is on a side of the first pixel 101 away from the second pixel 102. Optionally, a second power line 42 of the plurality of power lines 4 is connected to source electrode S of driving thin film transistors T1 of the first subpixel 11 of the second pixel 102, the second subpixel 12 of the second pixel 102, and the third subpixel 13 of the second pixel 102. Optionally, at least a portion of the second power line 42 is on a side of the second pixel 102 away from the first pixel 101.

Figure 9:
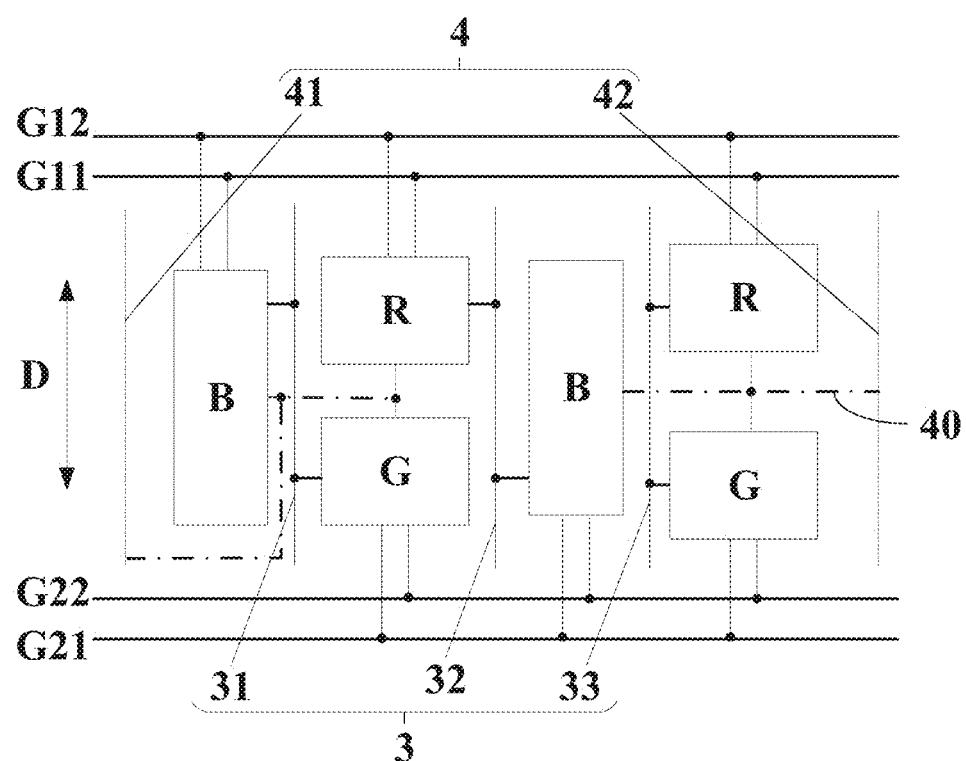
FIG. 9 is a circuit diagram illustrating an arrangement of power lines in an array substrate in some embodiments according to the present disclosure.

FIG. 9 is a circuit diagram illustrating an arrangement of power lines in an array substrate in some embodiments according to the present disclosure. In some embodiments, referring to FIG. 9, FIG. 3, and FIG. 4, the first power line 41 of the plurality of power lines 4 is connected to source electrodes S of driving thin film transistors T1 of the subpixel of the blue color B of the first pixel 101, the subpixel of the red color R of the first pixel 101, and the subpixel of the green color G of the first pixel 101. Optionally, a second power line 42 of the plurality of power lines 4 is connected to source electrode S of driving thin film transistors T1 of the subpixel of the blue color B of the second pixel 102, the subpixel of the red color R of the second pixel 102, and the subpixel of the green color G of the second pixel 102.

Figure 10:
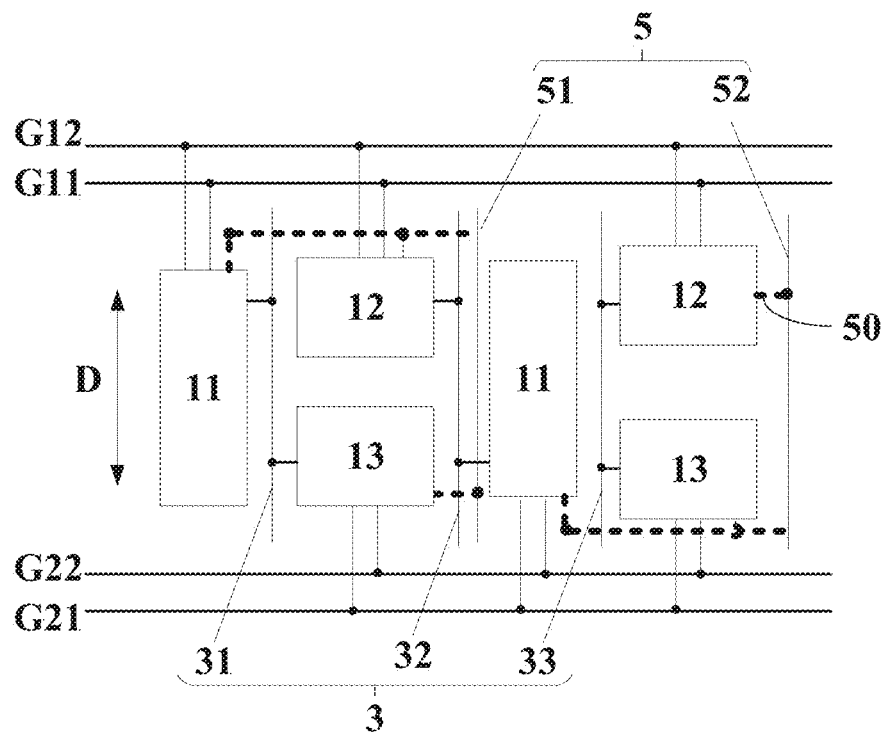
FIG. 10 is a circuit diagram illustrating an arrangement of sensing lines in an array substrate in some embodiments according to the present disclosure.

FIG. 10 is a circuit diagram illustrating an arrangement of sensing lines in an array substrate in some embodiments according to the present disclosure. In some embodiments, referring to FIG. 8 and FIG. 10, the array substrate further includes a plurality of sensing lines 5. Optionally, the three data lines (e.g., the first data line 31, the second data line 32, and the third data line 33), the plurality of power lines 4, and the plurality of sensing lines 5 are arranged along a substantially same direction D, for example, the direction D is a column direction. For example, the respective one of the plurality of sensing lines 5 is a continuous line extending along the column direction (e.g., the direction D).

Optionally, the array substrate further includes a plurality of sensing branches 50, shown in FIG. 10 with densely dotted lines. Three sensing branches of the plurality of sensing branches are configured to respectively three subpixels in a respective one of the plurality of pixels to a same sensing line.

Optionally, a first one of the plurality of sensing lines 5 and one of the plurality of power lines 4 are between two directly adjacent pixel groups of the plurality of pixel groups 100. Optionally, a second one of the plurality of sensing lines 5 and one of the three data lines are between two pixels (e.g., the first pixel 101 and the second pixel 102) in a same pixel group of the plurality of pixel groups 100. For example, referring to FIG. 10 and FIG. 5A, a sensing line 53 and a power line 43 are between two directly adjacent pixel groups of the plurality of pixel groups 100. A sensing line 54 and a data line 34 are between two pixels (e.g., the first pixel 101 and the second pixel 102) in a same pixel group of the plurality of pixel groups 100.

Optionally, a ratio of a total number of columns of subpixels to a total number of the plurality of sensing lines 5 is 2:1. Optionally, a column of pixels is between two adjacent sensing lines of the plurality of sensing lines 5. Optionally, two columns of subpixels are between two adjacent sensing lines of the plurality of sensing lines 5.

In some embodiments, referring to FIG. 10, FIG. 3, and FIG. 4, the plurality of sensing lines 5 includes a first sensing line 51 and a second sensing line 52. Optionally, a first sensing line 51 of the plurality of sensing lines 5 is connected to a drain electrode D of a sensing thin film transistor T3 of the first subpixel 11 of the first pixel 103, a drain electrode D of a sensing thin film transistor T3 of the second subpixel 12 of the first pixel 101, and a drain electrode D of a sensing thin film transistor T3 of the third subpixel 13 of the first pixel 101. Optionally, at least a portion of the first sensing line 51 is between the first pixel 101 and the second pixel 102. Optionally, a second sensing line 52 of the plurality of sensing lines 5 is connected to a drain electrode D of a sensing thin film transistor T3 of the first subpixel 11 of the second pixel 102, a drain electrode D of a sensing thin film transistor T3 of the second subpixel 12 of the second pixel 102, and a drain electrode D of a sensing thin film transistor T3 of the third subpixel 13 of the second pixel 102. Optionally, at least a portion of the second sensing line 52 is on a side of the second pixel 102 away from the first pixel 101.

Figure 11:
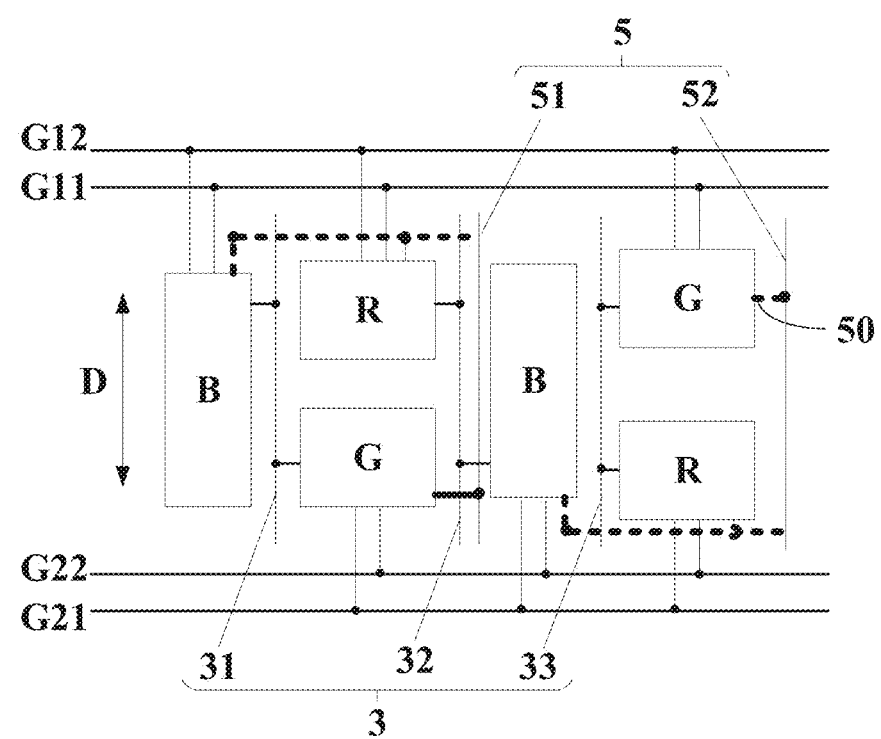
FIG. 11 is a circuit diagram illustrating an arrangement of sensing lines in an array substrate in some embodiments according to the present disclosure.

FIG. 11 is a circuit diagram illustrating an arrangement of sensing lines in an array substrate in some embodiments according to the present disclosure. In some embodiments, referring to FIG. 11, FIG. 3, and FIG. 4, a first sensing line 51 of the plurality of sensing lines 5 is connected to a drain electrode D of a sensing thin film transistor T3 of the subpixel of the blue color B of the first pixel 103, a drain electrode D of a sensing thin film transistor T3 of the subpixel of the red color R of the first pixel 101, and a drain electrode D of a sensing thin film transistor T3 of the subpixel of the green color G of the first pixel 101. Optionally, a second sensing line 52 of the plurality of sensing lines 5 is connected to a drain electrode D of a sensing thin film transistor T3 of the subpixel of the blue color B of the second pixel 102, a drain electrode D of a sensing thin film transistor T3 of the subpixel of the red color R of the second pixel 102, and a drain electrode D of a sensing thin film transistor T3 of the subpixel of the green color G of the second pixel 102.

Optionally, in a same pixel groups, a ratio of a total number of sensing lines to a total number of subpixels is 1:3, a ratio of a total number of power lines to a total number of subpixels is 1:3.

In some embodiments, referring to FIG. 3 and FIG. 4, in a respective one of the three subpixels SP (e.g., the first subpixel 11, the second subpixel 12, and the third subpixel 13), a drain electrode D of a switching thin film transistor T2 is connected to a gate electrode G of a driving thin film transistor T1 and a first electrode E1 of a storage capacitor Cst; a drain electrode D of a driving thin film transistor T1 is connected to a first electrode LE1 of a light emitting element 7, a second electrode E2 of the storage capacitor Cst, and a source electrode S of a sensing thin film transistor T3; and a second electrode LE2 of the light emitting element 7 is connected to a low voltage signal line (e.g., a VSS line).

The present disclosure provides a subpixel arrangement having a plurality of subpixel groups, and the respective one of the plurality of pixel groups includes six subpixels. In the same pixel group, the ratio of the total number of sensing lines to the total number of subpixels is 1:3. In the same pixel group, two subpixels of different colors share a same data line, the ratio of the total number of data lines to the total number of subpixel is 1:2. In a conventional subpixel arrangements, in a respective one of the plurality rows of subpixels, the ratio of the total number of data lines to the total number of subpixels is 1:1. Compared to the convolutional subpixel arrangement, the subpixel arrangement disclosed in the present disclosure uses less data lines, which leads to a reduction of the source integrated circuits. The present disclosure adopts a dual-gate design allowing circuits to be arranged in a limited wiring space but still allowing the circuits to fulfill optical compensation to improve display quality.

In another aspect, the present disclosure also provides a display panel. In some embodiments, the display panel includes the array substrate described herein. Optionally, the display panel is an AMOLED display panel having 8K resolution.

In another aspect, the present disclosure also provides a display apparatus. In some embodiments, the display apparatus includes the array substrate described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, OLED display apparatus, etc.

In another aspect, the present disclosure also provides a method of driving an array substrate. In some embodiments, the method is used to drive the array substrate described herein.

Figure 12:
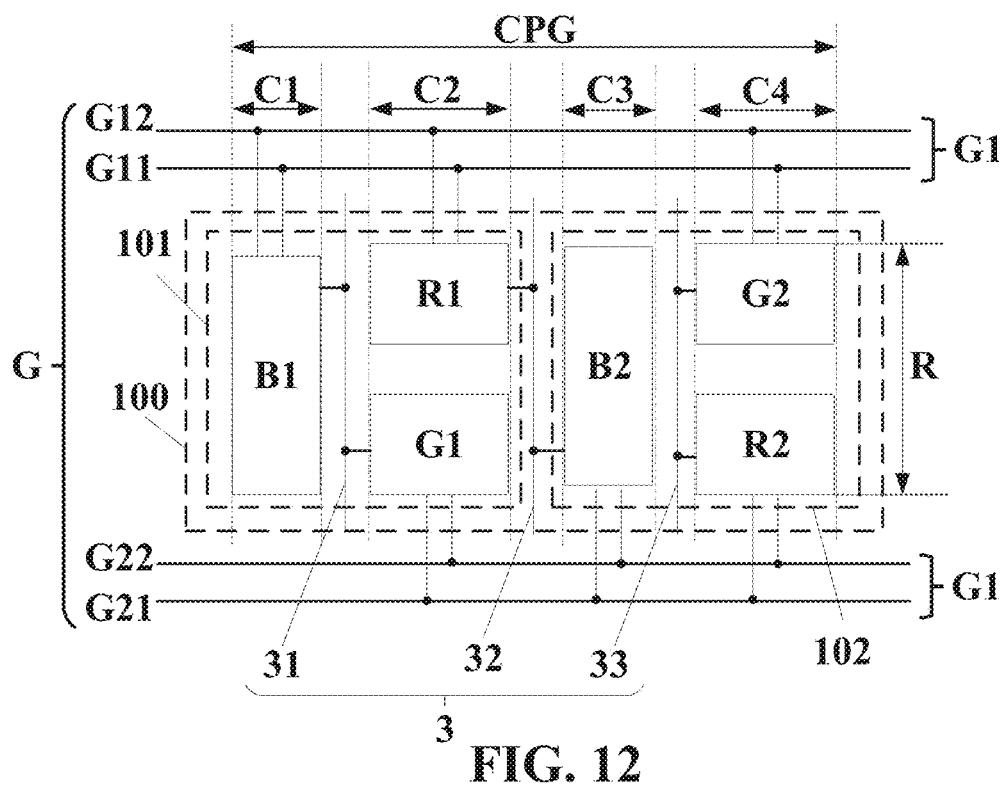
FIG. 12 is a circuit diagram illustrating an arrangement of subpixels in an array substrate in some embodiments according to the present disclosure.
Figure 13:
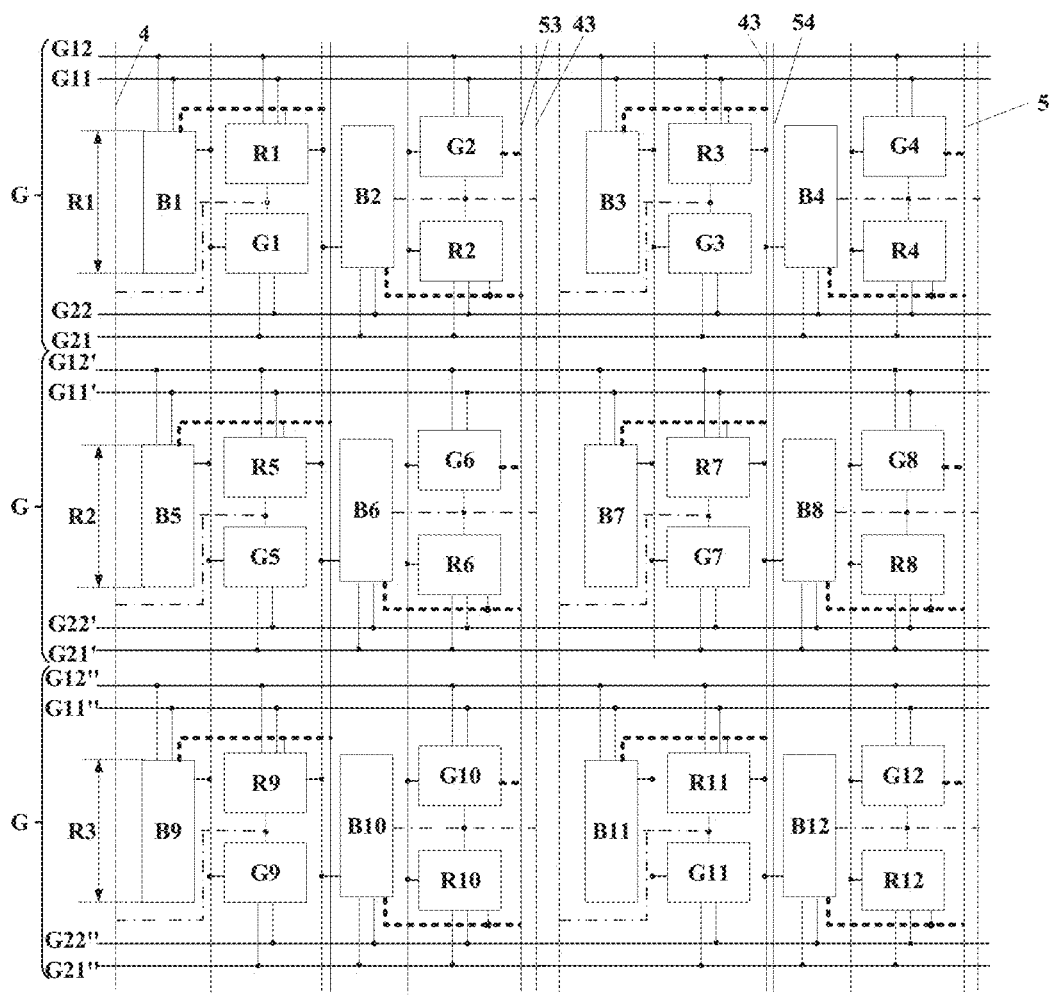
FIG. 13 is a circuit diagram illustrating an arrangement of subpixels in an array substrate in some embodiments according to the present disclosure.

FIG. 12 is a circuit diagram illustrating an arrangement of subpixels in an array substrate in some embodiments according to the present disclosure. FIG. 13 is a circuit diagram illustrating an arrangement of subpixels in an array substrate in some embodiments according to the present disclosure. Referring to FIG. 12 and FIG. 13, in some embodiments, the array substrate includes a plurality of pixel groups 100. Optionally, a respective one of the plurality of pixel groups 100 includes two adjacent pixels, e.g., a first pixel 101, and a second pixel 102, in a same row of pixels. Optionally, a respective one of the two adjacent pixels includes three subpixels of different colors, e.g., a subpixel of the blue color B, a subpixel of the red color R, a subpixel of the green color G. For example, the first pixel 101 includes a subpixel of the blue color B1, a subpixel of the red color R1, and a subpixel of the green color G1, the second pixel 102 includes a subpixel of the blue color B2, a subpixel of the rede color R2, and a subpixel of green color G2.

Optionally, the array substrate includes a plurality of scanning line groups G configured to respectively control a plurality of rows of pixels R. Optionally, a respective one group of the plurality of scanning line groups G includes two sets of scanning lines, e.g., a first set of scanning lines G1, and a second set of scanning lines G2.

Optionally, the array substrate includes a plurality of data line groups 3 respectively connected to a plurality of columns of pixel groups CPG of the plurality of pixel groups 100. Optionally, a respective one group of the plurality of data line groups 3 includes three data lines, e.g., a first data line 31, a second data line 32, and a third data line 33.

In some embodiment, the method of driving the array substrate includes displaying a frame of image including a plurality of sub-frames of sub-images. Optionally, the array substrate includes a plurality of sets of scanning lines, scanning signals are applied to the plurality of sets of scanning lines one set by one set, so that subpixels connected to the respective one of the plurality of sets of scanning lines are control to display a respective one of the plurality of sub-frames of sub-images. Optionally, the respective one groups of the plurality of scanning line groups includes the first set of scanning lines and the second set of scanning lines, the first set of scanning lines controls subpixels connected to it to display a first sub-frame of first sub-image, and the second set of scanning lines controls subpixels connected to it to display a second sub-frame of second sub-image. For example, the plurality of sub-frames of sub-images include a plurality of first sub-frames of first sub-images and a plurality of second sub-frames of second sub-images, the plurality of first sub-frames of first sub-images and plurality of second sub-frames of second sub-images are alternatively displayed.

Optionally, a frequency of frames of images displayed by the array substrate is a first frequency. Optionally, a frequency of data signals input in the plurality of data line groups is a second frequency which is double of the first frequency. Optionally, a frequency of scanning signals input in the plurality of scanning line groups is the second frequency which is double of the first frequency. For example, the frequency of frames of images displayed by the array substrate is 60 Hz, the frequency of data signals input in the plurality of data line groups is 120 Hz.

In some embodiments, in a same sub-frame of sub-image, data signals are provided to any two subpixels that are respectively connected to a same set of two scanning lines but respectively connected to different data lines. For example, referring to FIG. 13, data signals are provided to B1 and R1 in a same sub-frame of sub-image.

In some embodiments, data signals are provided to different subpixels that are respectively connected to different data lines and respectively connected to different sets of two scanning lines respectively in different sub-frames of sub-images. Optionally, data signals are provided to different subpixels in a same row of pixel groups of the plurality of pixel groups that are respectively connected to different data lines and respectively connected to different sets of two scanning lines respectively in different sub-frames of sub-images. For example, data signals are provided to B1 and B2 respectively in different sub-frames of sub-images.

In some embodiments, in a same sub-frame of sub-image, data signals are applied to any two subpixels of a same color that are respectively connected to a same data line, wherein the any two subpixels that are respectively connected to the same data line are respectively connected to different sets of two scanning lines. For example, data signals are applied to B1 and B5 in a same sub-frame of sub-image.

In some embodiments, the method of driving the array substrate described herein includes one or more elements selected from (1) in a same sub-frame of sub-image, data signals are provided to any two subpixels that are respectively connected to a same set of two scanning lines but respectively connected to different data lines; (2) data signals are provided to different subpixels that are respectively connected to different data lines and respectively connected to different sets of two scanning lines respectively in different sub-frames of sub-images, optionally, data signals are provided to different subpixels in a same row of pixel groups of the plurality of pixel groups that are respectively connected to different data lines and respectively connected to different sets of two scanning lines respectively in different sub-frames of sub-images; and (3) in a same sub-frame of sub-image, data signals are applied to any two subpixels of a same color that are respectively connected to a same data line, wherein the any two subpixels that are respectively connected to the same data line are respectively connected to different sets of two scanning lines.

In some embodiments, data signals are provided to any two subpixels of different colors that are respectively connected to a same data line but respectively connected to different sets of two scanning lines, respectively in different sub-frames of sub-images. For example, data signals are provided to B1 and G respectively in different sub-frames of sub-images.

In some embodiments in a respective one of the plurality of pixel groups, the driving methods includes the one or more elements selected from (1) in a same sub-frame of sub-image, data signals are provided to any two subpixels that are respectively connected to a same set of two scanning lines but respectively connected to different data lines; (2) data signals are provided to different subpixels that are respectively connected to different data lines and respectively connected to different sets of two scanning lines respectively in different sub-frames of sub-images, optionally, data signals are provided to different subpixels in a same row of pixel groups of the plurality of pixel groups that are respectively connected to different data lines and respectively connected to different sets of two scanning lines respectively in different sub-frames of sub-images; and (3) data signals are provided to any two subpixels of different colors that are respectively connected to a same data line but respectively connected to different sets of two scanning lines, respectively in different sub-frames of sub-images.

Figure 14:
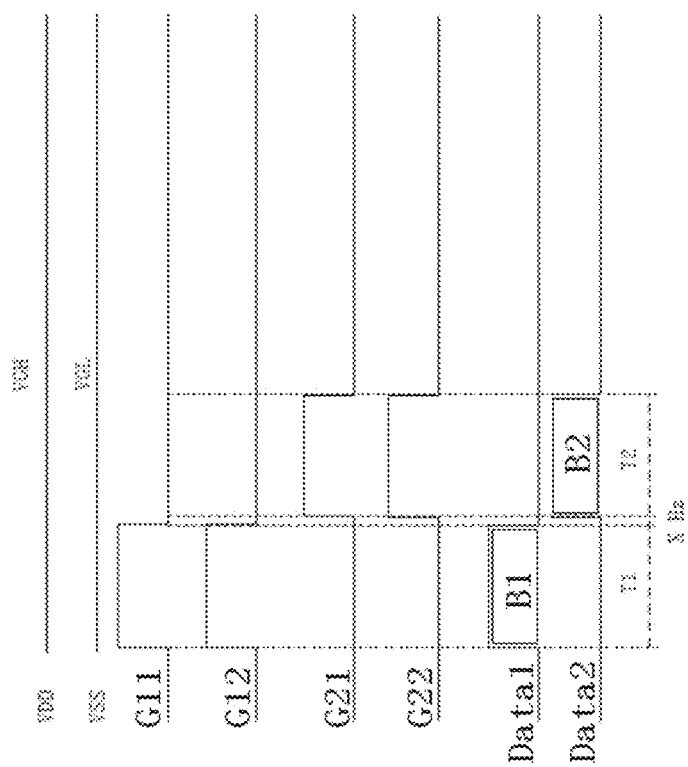
FIG. 14 is a timing diagram of operating subpixels of a same color in some embodiments according to the present disclosure.

FIG. 14 is a timing diagram of operating subpixels of a same color in some embodiments according to the present disclosure. In some embodiments, referring to FIG. 12, FIG. 13, and FIG. 14, when the array substrate is configured to display the blue color, in a first time period T1, the first scanning line G11 and the second scanning line G12 are turned on, the first data line 31 transmits a data signal having a first grey scale voltage value of the blue color to the subpixel of the blue color B1 of the first pixel 101 (e.g. the first subpixel of the first pixel); in a second time period T2, the third scanning line G21 and the fourth scanning line G22 are turned on, the second data line 32 transmits a data signal having a second grey scale voltage value of the blue color to the subpixel of the blue color B2 of the second pixel 102 (e.g., the first subpixel of the second pixel). Optionally, the first grey scale voltage value of the blue color and the second grey scale voltage value of the blue color are the same.

When the array substrate is configured to display the red color, in a first time period T1, the first scanning line G11 and the second scanning line G12 are turned on, the second data line 32 transmits a data signal having a first grey scale voltage value of the red color to the subpixel of the red color R1 of the first pixel 101 (e.g. the second subpixel of the first pixel); in a second time period T2, the third scanning line G21 and the fourth scanning line G22 are turned on, the third data line 33 transmits a data signal having a second grey scale voltage value of the red color to the subpixel of the red color R2 of the second pixel 102 (e.g., the third subpixel of the second pixel). Optionally, the first grey scale voltage value of the red color and the second grey scale voltage value of the red color are the same.

When the array substrate is configured to display the green color, in a first time period T1, the first scanning line G11 and the second scanning line G12 are turned on, the first data line 31 transmits a data signal having a first grey scale voltage value of the green color to the subpixel of the green color G1 of the first pixel 101 (e.g. the third subpixel of the first pixel); in a second time period T2, the third scanning line G21 and the fourth scanning line G22 are turned on, the third data line 33 transmits a data signal having a second grey scale voltage value of the green color to the subpixel of the green color G2 of the second pixel 102 (e.g., the second subpixel of the second pixel). Optionally, the first grey scale voltage value of the green color and the second grey scale voltage value of the green color are the same.

Figure 15:
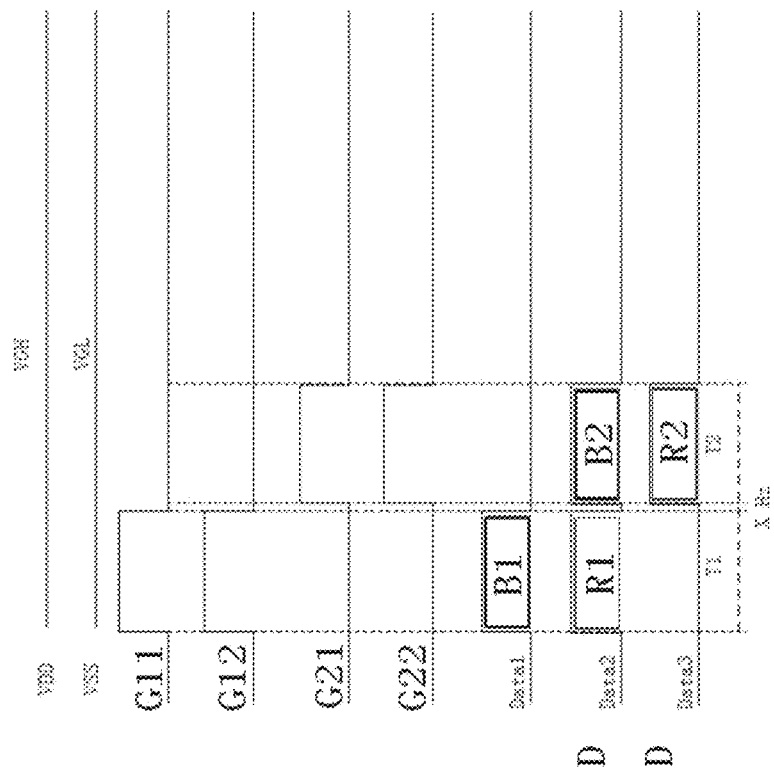
FIG. 15 is a timing diagram of operating subpixels of different colors in some embodiments according to the present disclosure.

FIG. 15 is a timing diagram of operating subpixels of different colors in some embodiments according to the present disclosure. In some embodiments, referring to FIG. 12, FIG. 13, and FIG. 15, when the array substrate is configured to display the red color and the blue color. In a first time period T1, the first scanning line G and the second scanning line G12 are turned on, the first data line 31 transmits a data signal having a first gray scale value of the blue color to the subpixel of blue color B1 of the first pixel 101 (e.g., the first subpixel of the first pixel), and the second data line 32 transmits a data signal having a third gray scale value of the red color to the subpixel of red color R1 of the first pixel 101 (e.g., the second subpixel of the first pixel); in the second time period T2, the third scanning line G21 and the fourth scanning line G22 are turned on, the second data line 32 transmits a data signal having a second gray scale value of the blue color to the subpixel of blue color B2 of the second pixel 102 (e.g., the first subpixel of the second pixel), and the third data line 33 transmits a data signal having a fourth gray scale value of the red color to the subpixel of red color R2 of the second pixel 102 (e.g., the third subpixel of the second pixel). Optionally, the first gray scale value of the blue color and the second gray scale value of the blue color are the same, the third gray scale value of the red color and the fourth gray scale value of the red color are the same.

When the array substrate is configured to display the green color and the blue color. In a first time period T1, the first scanning line G11 and the second scanning line G12 are turned on, the first data line 31 transmits a data signal having a first gray scale value of the blue color to the subpixel of blue color B1 of the first pixel 101 (e.g., the first subpixel of the first pixel), and the third data line 33 transmits a data signal having a fifth gray scale value of the green color to the subpixel of green color G2 of the first pixel 101 (e.g., the second subpixel of the second pixel); in the second time period T2, the third scanning line G21 and the fourth scanning line G22 are turned on, the first data line 31 transmits a data signal having a sixth gray scale value of the green color to the subpixel of green color G1 of the first pixel 101 (e.g., the third subpixel of the first pixel), and the second data line 32 transmits a data signal having a second gray scale value of the blue color to the subpixel of blue color B2 of the second pixel 102 (e.g., the first subpixel of the second pixel). Optionally, the first gray scale value of the blue color and the second gray scale value of the blue color are the same, and the fifth gray scale value of the green color and the sixth gray scale value of the green color are the same.

When the array substrate is configured to display the red color and the green color. In a first time period T1, the first scanning line G11 and the second scanning line G12 are turned on, the second data line 32 transmits a data signal having a third gray scale value of the red color to the subpixel of red color R1 of the first pixel 101 (e.g., the second subpixel of the first pixel), and the third data line 33 transmits a data signal having a fifth gray scale value of the green color to the subpixel of green color G2 of the first pixel 101 (e.g., the second subpixel of the second pixel); in the second time period T2, the third scanning line G21 and the fourth scanning line G22 are turned on, the first data line 31 transmits a data signal having a sixth gray scale value of the green color to the subpixel of green color G1 of the first pixel 101 (e.g., the third subpixel of the first pixel), and the third data line 33 transmits a data signal having a fourth gray scale value of the red color to the subpixel of red color R2 of the second pixel 102 (e.g., the third subpixel of the second pixel). Optionally, the third gray scale value of the red color and the fourth gray scale value of the red color are the same, and the fifth gray scale value of the green color and the sixth gray scale value of the green color are the same.

In some embodiments, a frequency of frames of images is X Hz, since two subpixels share a same data line, in order to prevent one of the two subpixels sharing the same data line from incorrectly reading the data signal intended for the other, working frequencies of the first gate line G11, the second gate line G12, the third gate line G13, and the fourth gate line G14 is equal to or greater than 2× Hz, e.g., 2× Hz, 3× Hz, and 4× Hz.

Figure 16:
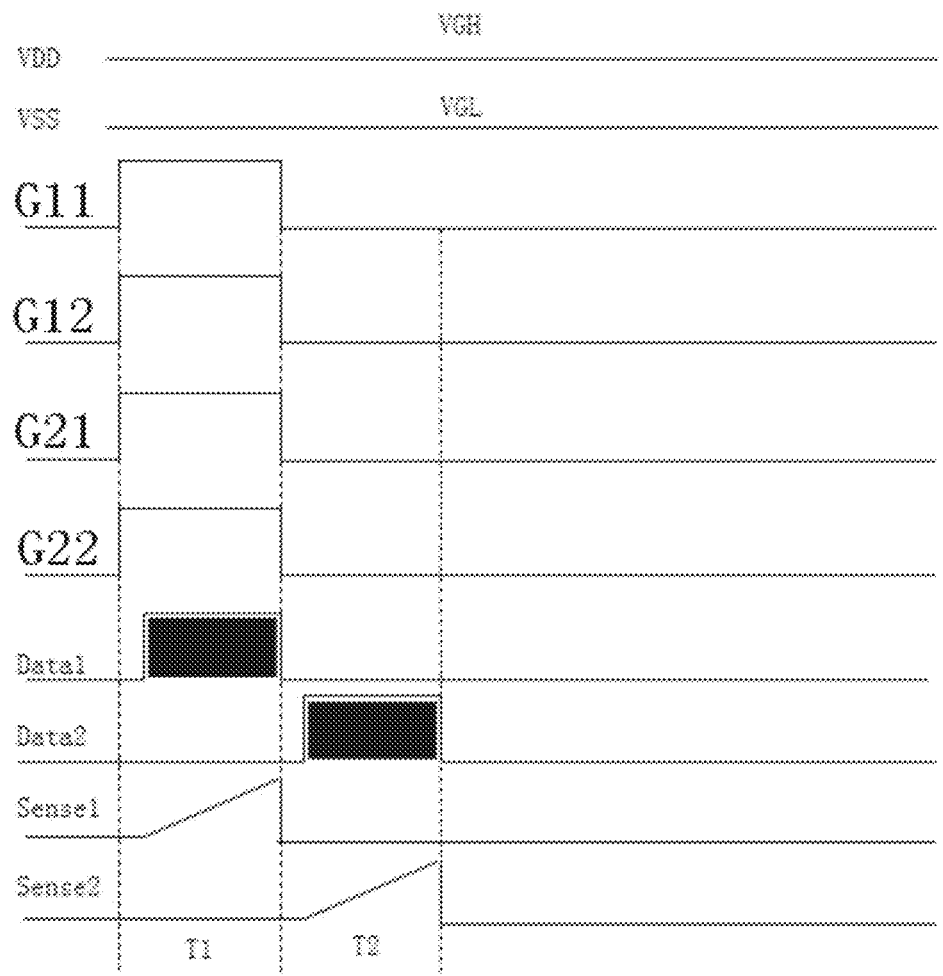
FIG. 16 is a time diagram of operating sensing thin film transistors in some embodiments according to the present disclosure.

FIG. 16 is a time diagram of operating sensing thin film transistors in some embodiments according to the present disclosure. In some embodiments, two sensing processes should be respectively performed on the first sub-frame of first sub-image and the second sub-frame of second sub-image. Referring to FIG. 16, when the array substrate is configured to display the blue color, in a first time period T1, the first scanning line G11 and the second scanning line G12 are turned on, the first data line 31 transmits a data signal having a first grey scale voltage value of the blue color to the subpixel of the blue color B1 of the first pixel 101 (e.g. the first subpixel of the first pixel), a sensing thin film transistor in the subpixel of the blue color B1 of the first pixel 101 is used to perform a first sensing process; in a second time period T2, the third scanning line G21 and the fourth scanning line G22 are turned on, the second data line 32 transmits a data signal having a second grey scale voltage value of the blue color to the subpixel of the blue color B2 of the second pixel 102 (e.g., the first subpixel of the second pixel), a sensing thin film transistor in the subpixel of the blue color B2 of the second pixel 102 are used to perform a second sensing process.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
  a plurality of pixel groups, a respective one of the plurality of pixel groups comprising two adjacent pixels in a same row of pixels, a respective one of the two adjacent pixels comprising three subpixels;
  a plurality of scanning line groups configured to respectively control a plurality of rows of pixels, a respective one group of the plurality of scanning line groups comprising four scanning lines; and
  a plurality of data line groups respectively connected to a plurality of columns of pixel groups of the plurality of pixel groups, a respective one group of the plurality of data line groups comprising three data lines;
  wherein the two adjacent pixels comprises a first pixel and a second pixel;
  each of the first pixel and the second pixel comprises a first subpixel, a second subpixel, and a third subpixel;
  each of the first subpixel, the second subpixel, and the third subpixel comprises a pixel driving circuit and a light emitting element connected to the pixel driving circuit, the pixel driving circuit comprising a switching thin film transistor, a driving thin film transistor, a sensing thin film transistor, and a storage capacitor;
  the four scanning lines comprises a first scanning line, a second scanning line, a third scanning line, and a fourth scanning line;
  a gate electrode of a switching thin film transistor of the first subpixel of the first pixel, a gate electrode of a switching thin film transistor of the second subpixel of the first pixel, and a gate electrode of a switching thin film transistor of the second subpixel of the second pixel are respectively connected to the first scanning line;
  a gate electrode of a sensing thin film transistor of the first subpixel of the first pixel, a gate electrode of a sensing thin film transistor of the second subpixel of the first pixel, and a gate electrode of a sensing thin film transistor of the second subpixel of the second pixel are respectively connected to the second scanning line;
  a gate electrode of a switching thin film transistor of the third subpixel of the first pixel, a gate electrode of a switching thin film transistor of the first subpixel of the second pixel, and a gate electrode of a switching thin film transistor of the third subpixel of the second pixel are respectively connected to the third scanning line; and
  a gate electrode of a sensing thin film transistor of the third subpixel of the first pixel, a gate electrode of a sensing thin film transistor of the first subpixel of the second pixel, and a gate electrode of a sensing thin film transistor of the third subpixel of the second pixel are respectively connected to the fourth scanning line.

2. The array substrate of claim 1, wherein the respective one of the plurality of pixel groups comprises three pairs of subpixels respectively connected to the three data lines;
  in a respective pair of the three pairs of subpixels, one subpixel is connected to the first scanning line and the second scanning line, and another subpixel is connected to the third scanning line and the fourth scanning line.

3. The array substrate of claim 1, wherein the first scanning line and the second scanning line are on a first side of the respective one of the plurality of pixel groups; and
  the third scanning line and the fourth scanning line are on a second side of the respective one of the plurality of pixel groups, the second side being opposite to the first side.

4. The array substrate of claim 1, wherein the respective one of the group of the plurality of data line groups comprises a first data line, a second data line, and a third data line;
  the respective one of the plurality of pixel groups comprises:
  a column comprising the first subpixel of the first pixel; a column comprising the second subpixel and the third subpixel of the first pixel;
  a column comprising the first subpixel of the second pixel; and a column comprising the second subpixel and the third subpixel of the second pixel;

wherein the first data line is between the column having the first subpixel of the first pixel and the column having the second subpixel and the third subpixel of the first pixel;

the second data line is between the first pixel and the second pixel; and the third data line is between the column having the first subpixel of the second pixel and the column having the second subpixel and the third subpixel of the second pixel.

5. The array substrate of claim 1, wherein the array substrate is absent of any data line between two adjacent pixel groups of the plurality of pixel groups.

6. The array substrate of claim 1, wherein a ratio of a total number of columns of subpixels to a total number of data lines is 4:3.

7. The array substrate of claim 1, wherein a source electrode of the switching thin film transistor of the first subpixel of the first pixel and a source electrode of the switching thin film transistor of the third subpixel of the first pixel are respectively connected to the first data line;

a source electrode of the switching thin film transistor of the second subpixel of the first pixel and a source electrode of the switching thin film transistor of the first subpixel of the second pixel are respectively connected to the second data line; and a source electrode of the switching thin film transistor of the second subpixel of the second pixel and a source electrode of the switching thin film transistor of the third subpixel of the second pixel are respectively connected to the third data line.

8. The array substrate of claim 1, further comprising a plurality of power lines;

wherein the three data lines and the plurality of power lines are arranged along a substantially same direction; and a respective one of the plurality of power lines is spaced apart by at least one columns of subpixels from any data line.

9. The array substrate of claim 8, wherein a ratio of a total number of columns of subpixels to a total number of the plurality of power lines is 2:1.

10. The array substrate of claim 1, further comprising a plurality of power lines;

wherein a first power line of the plurality of power lines is connected to source electrodes of driving thin film transistors of the first subpixel of the first pixel, the second subpixel of the first pixel, and the third subpixel of the first pixel;

at least a portion of the first power line is on a side of the first pixel away from the second pixel;

a second power line of the plurality of power lines is connected to source electrode of driving thin film transistors of the first subpixel of the second pixel, the second subpixel of the second pixel, and the third subpixel of the second pixel; and at least a portion of the second power line is on a side of the second pixel away from the first pixel.

11. The array substrate of claim 8, further comprising a plurality of sensing lines;

wherein the three data lines, the plurality of power lines, and the plurality of sensing lines are arranged along a substantially same direction; and a first one of the plurality of sensing lines and one of the plurality of power lines are between two directly adjacent pixel groups of the plurality of pixel groups; and a second one of the plurality of sensing lines and one of the three data lines are between two pixels in a same pixel group of the plurality of pixel groups.

12. The array substrate of claim 11, wherein a ratio of a total number of columns of subpixels to a total number of the plurality of sensing lines is 2:1.

13. The array substrate of claim 1, further comprising a plurality of sensing lines;

wherein a first sensing line of the plurality of sensing lines is connected to a drain electrode of a sensing thin film transistor of the first subpixel of the first pixel, a drain electrode of a sensing thin film transistor of the second subpixel of the first pixel, and a drain electrode of a sensing thin film transistor of the third subpixel of the first pixel;

at least a portion of the first sensing line is between the first pixel and the second pixel;

a second sensing line of the plurality of sensing lines is connected to a drain electrode of a sensing thin film transistor of the first subpixel of the second pixel, a drain electrode of a sensing thin film transistor of the second subpixel of the second pixel, and a drain electrode of a sensing thin film transistor of the third subpixel of the second pixel; and at least a portion of the second sensing line is on a side of the second pixel away from the first pixel.

14. The array substrate of claim 1, wherein, in a respective one of the three subpixels, a drain electrode of a switching thin film transistor is connected to a gate electrode of a driving thin film transistor and to a first electrode of a storage capacitor;

a drain electrode of a driving thin film transistor is connected to a first electrode of a light emitting element, to a second electrode of the storage capacitor, and to a source electrode of a sensing thin film transistor; and a second electrode of the light emitting element is connected to a low voltage signal line.

15. The array substrate of claim 1, wherein the respective one of the plurality pixels comprises a subpixel of a blue color, a subpixel of a green color, and a subpixel of a red color.

16. A display apparatus, comprising the array substrate of claim 1; and one or more integrated circuits connected to the array substrate.

17. A method of driving an array substrate, wherein the array substrate comprises a plurality of pixel groups, a respective one of the plurality of pixel groups comprising two adjacent pixels in a same row of pixels, a respective one of the two adjacent pixels comprising three subpixels of different colors;

a plurality of scanning line groups configured to respectively control a plurality of rows of pixels, a respective one group of the plurality of scanning line groups comprising two sets of scanning lines; and a plurality of data line groups respectively connected to a plurality of columns of pixel groups of the plurality of pixel groups, a respective one group of the plurality of data line groups comprising three data lines;

the method comprises displaying a frame of image comprising a plurality of sub-frames of sub-images;

wherein, in a same sub-frame of sub-image, data signals are provided to any two subpixels that are respectively connected to a same set of two scanning lines but respectively connected to different data lines.

18. The method of claim 17, wherein data signals are provided to different subpixels in a same row of pixel groups of the plurality of pixel groups that are respectively connected to different data lines and respectively connected to different sets of two scanning lines respectively in different sub-frames of sub-images.

19. The method of claim 18, wherein, in a same sub-frame of sub-image, data signals are applied to any two subpixels of a same color that are respectively connected to a same data line, wherein the any two subpixels that are respectively connected to the same data line are respectively connected to different sets of two scanning lines.

20. The method of claim 19, wherein data signals are provided to any two subpixels of different colors that are respectively connected to a same data line but respectively connected to different sets of two scanning lines, respectively in different sub-frames of sub-images.

* * * * *